United States Patent [19]
Khoury

[11] Patent Number: 5,532,624
[45] Date of Patent: Jul. 2, 1996

[54] HIGH-SPEED AND ACCURATE SAMPLE AND HOLD CIRCUITS

[75] Inventor: John M. Khoury, New Providence, N.J.

[73] Assignee: AT&T Corp., Murray Hill, N.J.

[21] Appl. No.: 381,627

[22] Filed: Jan. 31, 1995

[51] Int. Cl.⁶ ................................................. H03K 5/159
[52] U.S. Cl. ........................... 327/95; 327/946; 326/98; 326/119
[58] Field of Search ................. 326/98, 119; 327/94–96

[56] References Cited

U.S. PATENT DOCUMENTS

| | | | |
|---|---|---|---|
| 4,585,956 | 4/1986 | Lie | 327/95 |
| 4,764,689 | 8/1988 | Thommen | 327/96 |
| 5,291,074 | 3/1994 | Nayebi | 327/96 |

*Primary Examiner*—David R. Hudspeth
*Assistant Examiner*—Andrew Sanders
*Attorney, Agent, or Firm*—Scott W. McLellan

[57] ABSTRACT

An improved sample and hold circuit utilizing a buffer circuit to reduce the effective resistance of the switches used to couple an input signal to storage capacitors. The effective resistance of the switches are reduced by placing the switches within the feedback path of the buffer. The buffer may be shared among multiple sample and hold circuits.

7 Claims, 2 Drawing Sheets

HIGH-SPEED AND ACCURATE SAMPLE AND HOLD CIRCUITS

BACKGROUND OF THE INVENTION

1. Field of the Invention

This invention relates to sample and hold circuits in general and, more particularly, to high-speed MOS sample and hold circuits.

2. Description of the Prior Art

Sample and hold (S&H) circuits are widely used in signal processing applications. There are many different designs, but all generally rely on an input switch to couple the input signal to be sampled to a storage device, which usually includes a capacitor. When the input signal is to be "held", the switch opens and a voltage approximately equal to the last value of the input signal is stored on the capacitor.

The degree of accuracy of the held signal value relative to the actual input signal value is largely a function of the resistance of the input switch and the time allocated for the sample. For the sample to be accurate with slowly varying signals, the time allocated for the sample must be many times the time constant of the sample and hold circuit, R×C, where R is the effective resistance of the input switch (which includes the resistance associated with the input signal driver to the input switch) and C is the effective capacitance of the storage capacitor (which includes any stray capacitance, Miller capacitance, etc.) and is usually a fixed value. The longer the sample time or the shorter the R×C time constant, the more the accuracy of the sample. For accurate acquisition of a sample, the sample time must be much greater than the time constant. A typical minimum sampling time of the five or more time constants are needed for better than a 0.1% sampling accuracy. Alternately, the time constant can be made smaller by making the capacitor smaller, but clock feedthrough and charge injection from the switches would increase.

The typical approach to increasing the speed and/or accuracy of a S&H circuit is to reduce the resistance of the input switch. Increasing the size of the MOS transistors in the switch have reduced the resistance but at the cost of increasing clock feedthrough and charge injection, both of which decrease the accuracy of the S&H.

In real-world applications, the input signal is time-varying and the sampling must be done at a high rate, such as near the Nyquist rate. Thus, the amount of time that can be allocated for the sample is short with a corresponding degradation in accuracy. In some applications, such as very high speed analog-to-digital converters or analog sampled data systems, the conventional S&H with the above improvements may not be accurate enough at the desired sampling rate.

Thus, it is desirable to provide a S&H circuit that allows for higher sampling rates than previous S&H circuits.

Further, it is desirable to provide a S&H circuit with higher accuracy at a given sampling rate than previous S&H circuits.

SUMMARY OF THE INVENTION

This and other aspects of the invention may be obtained generally in a sample and hold circuit having a sampling node therein, an input node, and an input switch for selectively coupling the input node to the sampling node during sampling and decoupling the input node from the sampling node when holding. The circuit is improved by adding a differential amplifier having an inverting input, a non-inverting input and an output, disposed between the input node and the input switch. The output of the differential amplifier connects to the input switch, the non-inverting input couples to the input node, and the inverting input couples to the sampling node.

This circuit arrangement allows for the reduction of the effective resistance of the input switch, thereby raising the highest frequency that can be sampled and/or increasing the accuracy of the sample.

The above circuit is useful in single-ended as well as fully differential sample and hold circuits.

BRIEF DESCRIPTION OF THE DRAWING

The foregoing features of this invention, as well as the invention itself, may be more fully understood from the following detailed description of the drawings, in which.

DETAILED DESCRIPTION

Figure 1:
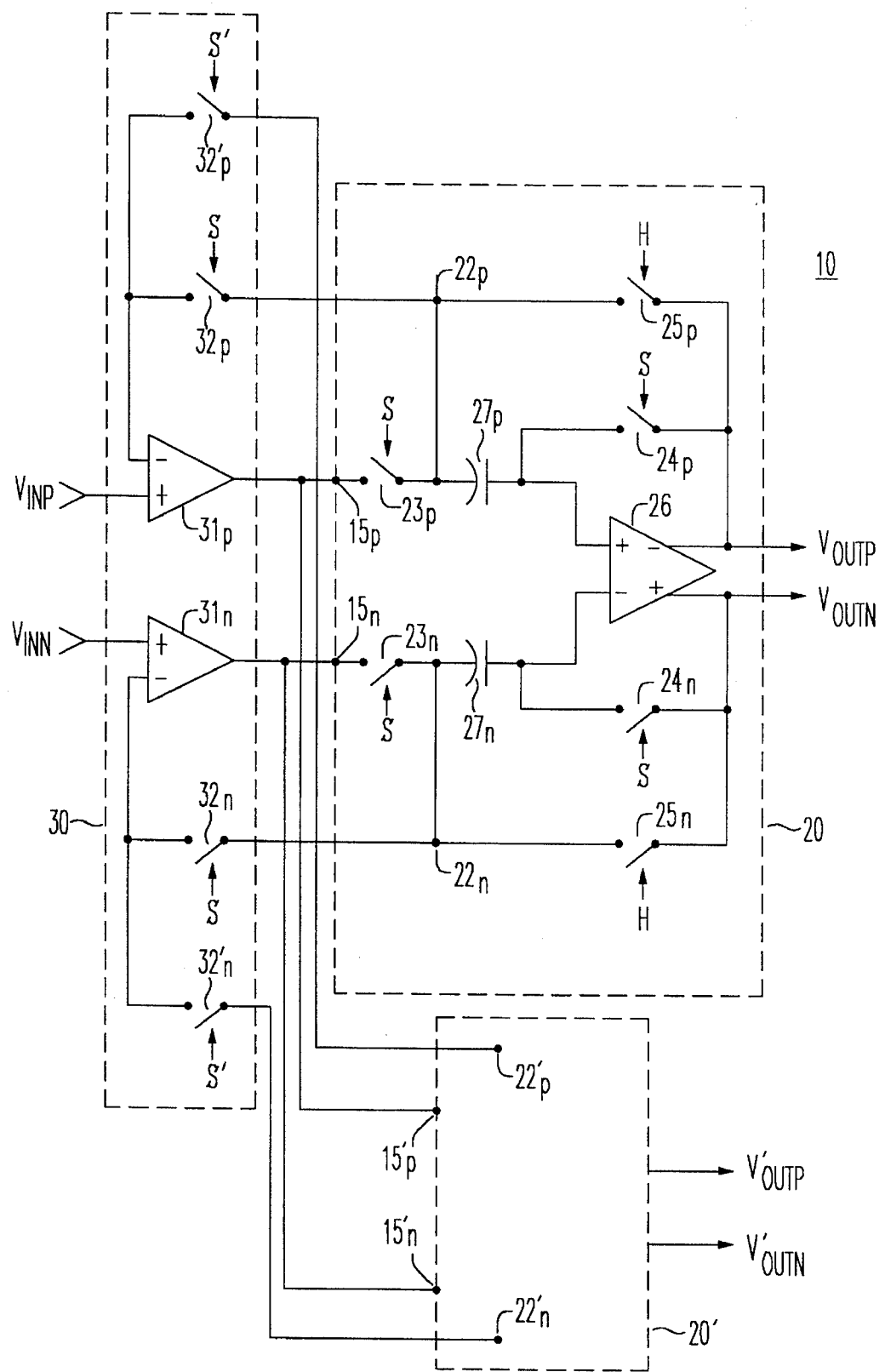
FIG. 1 is a simplified schematic diagram of a sample and hold circuit according to one exemplary embodiment of the invention.

Generally, the invention may understood by referring to FIG. 1 showing an improved sample and hold circuit 10.

Here, a conventional differential sample and hold circuit (referred to herein as a S&H) 20 has disposed between the S&H 20 and inputs $V_{INP}$ and $V_{INN}$ a buffer stage 30 having therein differential amplifiers 31p, 31n. The non-inverting inputs of amplifiers 31p, 31n, couple to the inputs $V_{INP}$ and $V_{INN}$ of the S&H 10. The inverting inputs of the amplifiers 31p, 31n couple to corresponding sampling nodes 22p, 22n. Within the S&H 20 are switches 23p, 23n which selectively couple the inputs 15p, 15n of the S&H 20 to the sampling nodes 22p, 22n during sampling and decoupling the input nodes from the sampling nodes when holding. Amplifiers 31p, 31n serve to reduce the effective resistance of switches 23p, 23n, thereby increasing the accuracy and sampling speed of the S&H 20, including an improvement in the linearity of the S&H 20.

While the embodiment shown here is fully differential, the advantage of the buffer 30 can be used in a single ended (non-differential) sample and hold circuit, as explained below.

Figure 2:
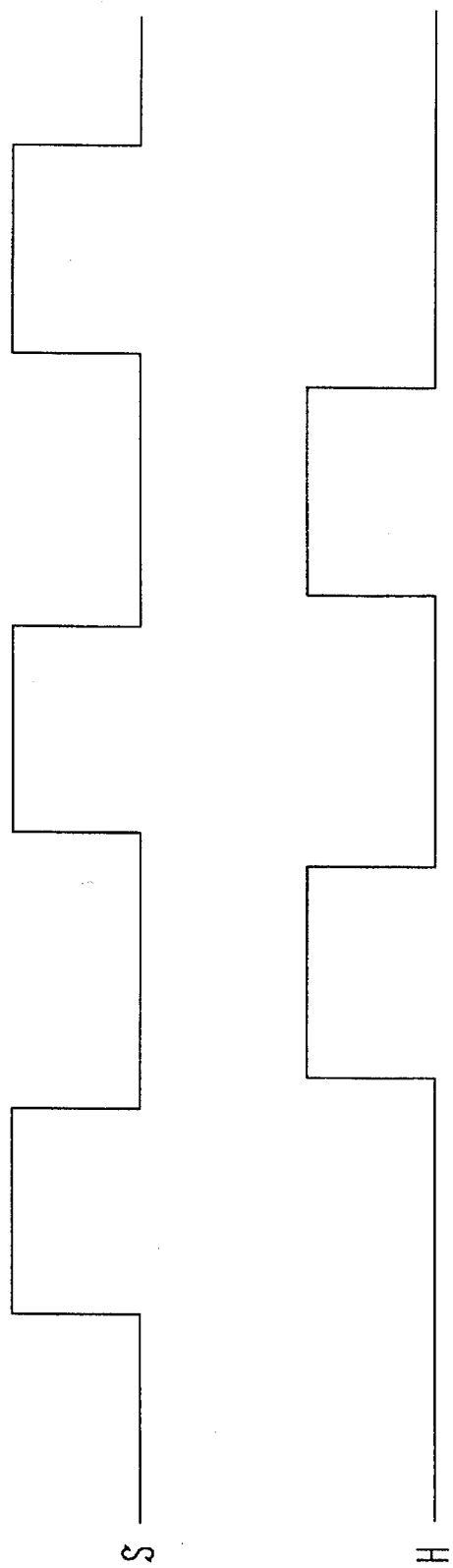
FIG. 2 is an exemplary timing diagram of sample and hold signals to the sample and hold circuit of FIG. 1.

In more detail in FIG. 1 and in accordance with one embodiment of the invention, the conventional S&H 20 has switches 23p, 23n, 24p, 24n driven by a clock signal S and switches 25p, 25n driven by clock signal H. Switches driven by clock signal S are closed during the sampling phase and switches driven by clock signal H are closed during the holding phase. Referring temporarily to FIG. 2, exemplary clock signals S and H are shown as being non-overlapping signals, with a signal going "high" indicating that the corresponding switches are closed. Thus, at no time are both the switches controlled by clock signal S closed simultaneously with switches controlled by clock signal H.

Returning to FIG. 1, when the switches controlled by clock signal S are closed (referred to as sampling switches 23p, 23n, 24p, 24n), then the inputs and outputs of amplifier 26 are shorted together, making the inputs to amplifier 26 fixed to virtual ground, and the inputs 15p, 15n are coupled to capacitors 27p, 27n. Thus, capacitors 27p, 27n take on the voltage applied to the inputs 15p, 15n. During holding, the sampling switches 23p, 23n, 24p, 24n are opened and switches controlled by clock signal H (referred to as holding switches 25p, 25n) are closed, maintaining the voltage on capacitors 27p, 27n to the last value applied thereto, and applying that voltage to the outputs $V_{OUTP}$, $V_{OUTN}$.

The differential amplifiers 31p, 31n couple the voltages applied to inputs $V_{INP}$, $V_{INN}$ to inputs 15p, 15n, respectively. During the sampling phase when input switches 23p and 23n are closed, pass switches 32p, 32n are also closed. Thus, amplifiers 31p, 31n operate as buffers with the input switches 23p, 23n as part of the loop from the output of corresponding amplifiers to the inverting inputs thereof. Since very little current flows through pass switches 32p, 32n (the amplifiers 31p, 31n preferably being MOS amplifiers), the effect of these switches can be ignored. However, since switches 23p, 23n do carry the current from the output of corresponding amplifiers to the capacitors 27p, 27n, the resistance of the switches 23p, 23n is critical, as mentioned above. Since the switches shown here are typically implemented with one or two MOS transistors alternatively known as transmission gates, the resistances of the switches is non-linear, i.e., the resistance varies with the voltage of the signal passing trough the switch. Since the switches 23p, 23n are within the feedback loop of the amplifiers 31p, 31n, respectively, the resistances thereof are reduced by the gain of the amplifiers 31p, 31n. Thus, during the sampling phase, the capacitors 27p, 27n are advantageously driven with a lower impedance without increasing the size of the transistors 23n, 23p, accruing the benefits discussed above.

It is noted that pass switches 32p, 32n (and corresponding switches 32'p, 32'n) are not necessary for operation of the disclosed embodiment of the invention. The purpose of the pass switches 32p, 32n, 32'p, 32'n is to allow sharing of the buffer 30 with multiple sample and hold circuits, such as exemplary S&H 20, 20'. S&H 20' is essentially the same as S&H 20 except, for example, the value of the capacitors therein (not shown). It is desirable to have for each additional S&H separate switches 32'p, 32'n, controlled by a sample clock signal S'.

It is understood that the improved sample and hold circuit 10 can be implemented in single-ended, non-differential, form. For example, if amplifier 26 were a conventional differential amplifier with a single output, then just the components on the lower-half of the diagram (components with suffixes of "n") may be used. Further, amplifiers 31p, 31n can be implemented with a single, fully balanced, amplifier, such as amplifier 26 but with four inputs and two outputs.

Having described the preferred embodiment of this invention, it will now be apparent to one of skill in the art that other embodiments incorporating its concept may be used. Therefore, this invention should not be limited to the disclosed embodiment, but rather should be limited only by the spirit and scope of the appended claims.

I claim:

1. A sample and hold circuit having a sampling node therein, an input node, and an input switch for selectively coupling the input node to the sampling node during sampling and decoupling the input node from the sampling node when holding, CHARACTERIZED BY:

a differential amplifier having an inverting input, a non-inverting input and an output, disposed between the input node and the input switch such that the output connects to the input switch, the non-inverting input couples to the input node, and the inverting input is coupled to the sampling node during sampling and is decoupled from the sampling node during holding by a pass switch.

2. The sample and hold circuit of claim 1, further characterized by at least one additional sample and hold circuit having an input switch and a sampling node, the input switch selectively coupling the sampling node to the differential amplifier output, and the differential amplifier inverting input selectively coupling to the sampling node by an additional pass switch;

wherein the coupling by the switches corresponding to the additional sample and hold circuit occur during the sampling phase for that circuit.

3. The sample and hold circuit of claim 2, wherein the switches are MOS transistors.

4. A differential sample and hold circuit having first and second sampling nodes therein, first and second input nodes, and first and second input switches for selectively coupling the corresponding first or second input node to the corresponding first or second sampling node during sampling and decoupling the input nodes from the sampling nodes when holding, CHARACTERIZED BY:

a first differential amplifier having an inverting input, a non-inverting input and an output, disposed between the first input node and the first input switch such that the output connects to the first input switch, the non-inverting input couples to the first input node, and the inverting input couples to the first sampling node; and a second differential amplifier having an inverting input, a non-inverting input and an output, disposed between the second input node and the second input switch such that the output connects to the second input switch, the non-inverting input couples to the second input node, and the inverting input couples to the second sampling node.

5. The sample and hold circuit of claim 4, wherein the inverting input to each differential amplifier is coupled to the corresponding first or second sampling node during the sampling phase and decoupled during the holding phase by first and second pass switches.

6. The sample and hold circuit of claim 5, further characterized by at least one additional sample and hold circuit having first and second input switches and first and second sampling nodes, the first input switch selectively coupling the first sampling node to the first differential amplifier output, the second input switch selectively coupling the second sampling node to the second differential amplifier output, the first differential amplifier inverting input selectively coupling to the first sampling node by an additional first pass switch, and the second differential amplifier inverting input selectively coupling to the second sampling node by an additional second pass switch;

wherein the coupling by the switches corresponding to the additional sample and hold circuit occur during the sampling phase for that circuit.

7. The sample and hold circuit of claim 6, wherein the switches are MOS transistors.

\* \* \* \* \*